United States Patent
Shih

(10) Patent No.: US 6,492,874 B1
(45) Date of Patent: Dec. 10, 2002

(54) ACTIVE BIAS CIRCUIT

(75) Inventor: Chuming David Shih, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/918,015

(22) Filed: Jul. 30, 2001

(51) Int. Cl.[7] .............................................. H03F 3/04
(52) U.S. Cl. ..................... 330/288; 330/289; 330/296
(58) Field of Search ................................ 330/288, 289, 330/296

(56) References Cited

U.S. PATENT DOCUMENTS

| | | | |
|---|---|---|---|
| 3,995,228 A | 11/1976 | Pass | |
| 4,220,930 A | 9/1980 | Ahmed | |
| 4,789,842 A | 12/1988 | Naxera | |
| 4,881,046 A | * 11/1989 | Tung | ........................ 330/277 |
| 4,975,632 A | 12/1990 | James et al. | |
| 5,469,111 A | 11/1995 | Chiu | |
| 5,570,065 A | 10/1996 | Eberhardt et al. | |
| 5,629,648 A | 5/1997 | Pratt | |
| 5,689,211 A | 11/1997 | Embree | |
| 5,724,004 A | * 3/1998 | Reif et al. | ................... 330/277 |
| 5,854,578 A | 12/1998 | Minasi et al. | |
| 5,949,274 A | 9/1999 | Stanchak | |
| 5,986,508 A | 11/1999 | Nevin | |
| 6,034,519 A | 3/2000 | Yang | |
| 6,046,642 A | 4/2000 | Brayton et al. | |
| 6,052,032 A | 4/2000 | Jarvinen | |
| 6,087,820 A | 4/2000 | Houghton et al. | |
| 6,091,279 A | 7/2000 | Hamparian | |
| 6,094,094 A | 7/2000 | Ohtake | |
| 6,259,324 B1 | 7/2001 | Antognetti et al. | |
| 6,300,837 B1 | * 10/2001 | Sowlati et al. | ............... 330/296 |
| 6,369,656 B2 | * 4/2002 | Dening et al. | ............... 330/296 |

* cited by examiner

*Primary Examiner*—Henry Choe
(74) *Attorney, Agent, or Firm*—Frank J. Bogacz

(57) ABSTRACT

An active bias circuit 30 connected to a power amplifier PA maintains a power amplifier DC quiescent current at a fixed value over a wide temperature range. The active bias circuit 30 includes first and second current mirror circuits 32, 34. The power amplifier PA is an element of the second current mirror circuit 34. A temperature compensation circuit 42 is connected to the first current mirror circuit 32 for providing temperature compensation therewith. A first reference voltage source is connected to the first current mirror circuit 32 by way of the temperature compensation circuit 42 for providing a first reference voltage Vref to the first current mirror circuit 32. A current sink 36 is connected to a transistor of the first current mirror circuit 32 and a voltage source adjustment circuit 38 is connected to the first current mirror circuit 32 for setting a voltage provided to the first current mirror circuit 32.

21 Claims, 3 Drawing Sheets

-PRIOR ART-

-PRIOR ART-

ACTIVE BIAS CIRCUIT

BACKGROUND OF THE INVENTION

The present invention relates to radio frequency (RF) power amplifiers and more particularly to a temperature compensating and load regulating active bias circuit for RF power amplifiers.

RF devices and circuits, such as used in cellular telephones and cellular telephone base stations, include power amplifiers. An amplifier provides a linear response if it's output is the same as it's input except that it has a different magnitude. In RF systems, one reason a linear response is required is because when two or more signals are input to a non-linear device, intermodulation noise is created, which can interfere with a desired signal. Intermodulation noise, as well as other performance factors of a power amplifier, which include gain, power added efficiency (PAE), output power, and adjacent channel powers (ACP) are functions of bias current. Thus, the bias current is a critical design factor.

Bias current is affected by temperature and process variations, as well as RF power variations. As is well known, cell phones and base stations are often exposed to a broad temperature range and varying RF power. Thus, there is a need to compensate for changes of bias current over temperature and power. Further, in order to improve the gain flatness and the linearity of power amplifiers for linear applications such as TDMA and CDMA power amplifiers, an active bias circuit should maintain the power amplifier's quiescent current at a fixed value over a wide range of temperatures. For saturated applications, such as GSM and analog power amplifiers, an active bias circuit should compensate for a bias voltage drop across the RF blocking resistor caused by the self-bias effect of nonconducting classes of power amplifiers (e.g., Class AB, B, C) and supply a significant amount of current to a power amplifier stage under a high RF driving power.

FIG. 1 is a schematic circuit diagram of a conventional power amplifier circuit 10. The power amplifier circuit 10 includes a RF power amplifier PA and a current mirror circuit having a single transistor Q1 for bias voltage adjustment. The transistor Q1 is used to track variations of threshold voltage over temperature and process. First and second resistors R1, R2 are provided to set the bias voltage of the RF PA stage. The first resistor R1 is connected between the drain of the transistor Q1 and a reference voltage source Vref. The second resistor R2 has a first terminal connected to a node N1 between the first resistor R1 and the drain of the transistor Q1 and a second terminal connected ground.

A RF blocking resistor RB has a first terminal connected to the gate of the power amplifier PA and a second terminal connected to one side of a set resistor RS and to the node N1. The other side of the set resistor RS is connected to the gate of the transistor Q1. A RF decoupling capacitor C1 is connected between the node N1 and ground. The RF blocking resistor RB and the decoupling capacitor C1 prevent RF signals from entering the bias circuit. The set resistor RS is used to set any voltage difference caused by current leaking between the RF PA stage and the transistor Q1. Although the power amplifier circuit 10 can provide bias voltage adjustment, it is not capable of current sourcing or load regulation.

FIG. 2 is a schematic circuit diagram of a second conventional power amplifier circuit 20. The power amplifier circuit 20 includes a power amplifier PA and a current mirror circuit including a first transistor Q1 and a second transistor Q2. The first transistor Q1 is used to track variations of threshold voltage over temperature and process. A first resistor R1 connected between the first transistor Q1 and a reference voltage Vref is used to set the bias current of the first transistor Q1. A second resistor R2, which is connected to a node N1 between the power amplifier PA and the first and second transistors Q1, Q2, and ground, is used to improve breakdown. The circuit 20 also has a RF blocking resistor Rb and a RF decoupling capacitor C1. The blocking resistor Rb and the decoupling capacitor C1 are used to prevent RF signals entering the bias circuit. First and second set resistors RS1 and RS2 are used to set any voltage difference caused by current leaking between the RF PA stage and the current mirror circuit. Although the second conventional power amplifier circuit 20 provides some measure of compensation for temperature and process variation, the circuit 20 does not have adequate capabilities to compensate for current variations over temperature and overcome the de-biasing effect at high RF drive. Further, the second resistor R2 consumes very large amounts of current for all operations.

It is an object of the present invention to provide an active bias circuit for a power amplifier that provides good compensation for variations in temperature and power.

SUMMARY OF THE INVENTION

In order to provide an active bias circuit for a power amplifier, the present invention provides an active bias circuit connected to a power amplifier. The active bias circuit includes first and second current mirror circuits connected to the power amplifier for maintaining a DC quiescent current to the amplifier at a generally fixed value over a wide temperature range. The power amplifier is an element of the second current mirror circuit. A temperature compensation circuit is connected to the first current mirror circuit for providing temperature compensation therewith. A first reference voltage source is connected to the first current mirror circuit by way of the temperature compensation circuit for providing a first reference voltage Vref to the first current mirror circuit. A current sink is connected to a transistor of the first current mirror circuit and a voltage source adjustment circuit is connected to the first current mirror circuit for setting a voltage provided to the first current mirror circuit.

In another embodiment, the invention provides an active bias circuit for maintaining a power amplifier DC quiescent current at a fixed value over a wide temperature range. The active bias circuit has first and second current mirror circuits. The first current mirror circuit includes a first transistor Q1, a second transistor Q2 having a gate connected to a drain of the first transistor Q1 and a drain connected to a first reference voltage source for receiving a first reference voltage Vref, and a fourth transistor Q4 having a drain connected to a second reference voltage source for receiving a second reference voltage Vabc, and a gate connected to a source of the second transistor Q2 and to a gate of the first transistor Q1. The second current mirror circuit includes the fourth transistor Q4, a third transistor Q3 having a drain connected to the source of the second transistor Q2 at a first node N1, and a source connected to ground, and a power amplifier having a drain connected to a third reference voltage source for receiving a third reference voltage Vdd, a source connected to ground, and a gate connected to a gate of the third transistor Q3 at a second node N2. A temperature compensation circuit includes a first resistor R1 and a second resistor R2. The first resistor R1 has a first terminal connected to the first reference voltage source and a second terminal connected to the drain of the second transistor Q2. The second resistor R2 has a first terminal connected to the second terminal of the first resistor R1 and a second terminal connected to the drain of the first transistor Q1. A voltage source adjustment circuit includes a set resistor Rset connected between a source of the first transistor Q1 and ground.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1:
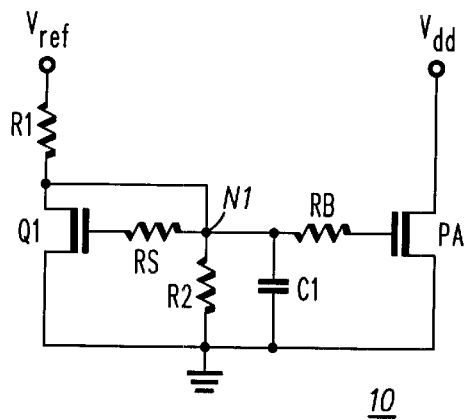
FIG. 1 is a schematic circuit diagram of a first conventional power amplifier circuit.
Figure 2:
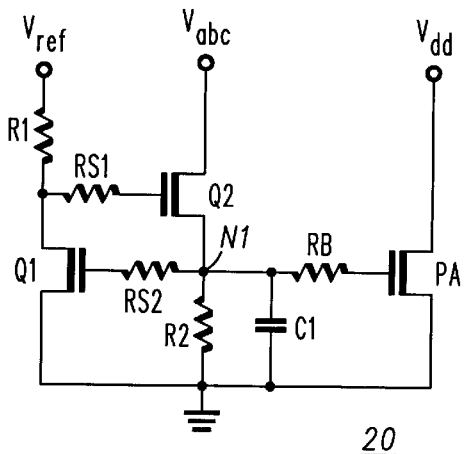
FIG. 2 is a schematic circuit diagram of a second conventional power amplifier circuit.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are encompassed within the spirit and scope of the invention. In the drawings, like numerals are used to indicate like elements throughout.

Figure 3:
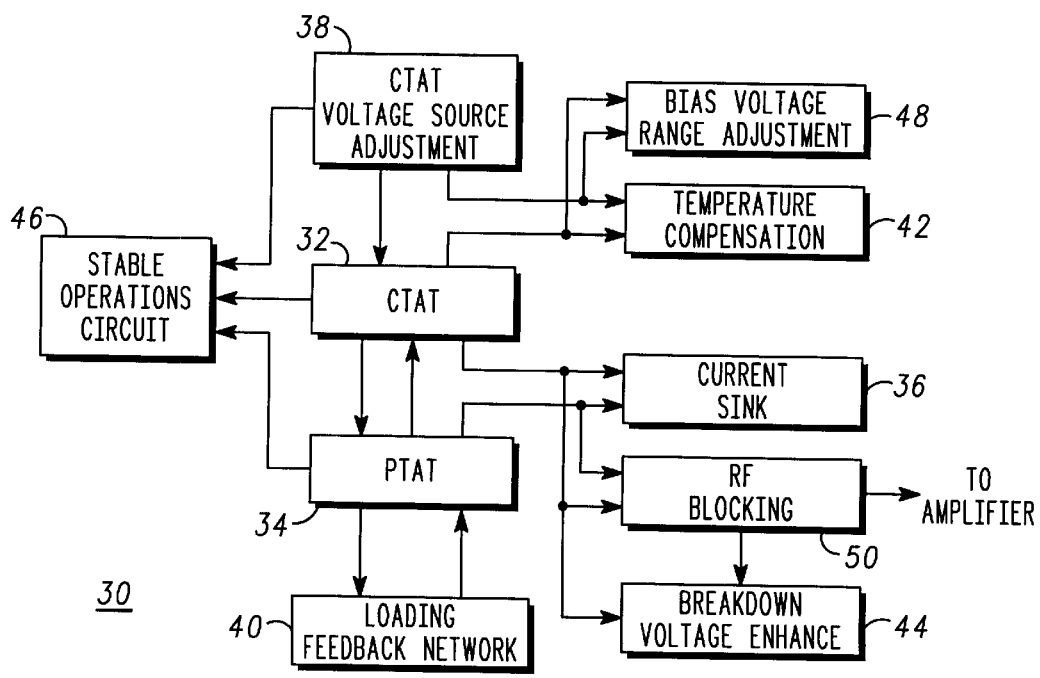
FIG. 3 is a schematic block diagram of an active bias circuit in accordance with an embodiment of the present invention.

Referring now to FIG. 3, a schematic block diagram of an active bias circuit 30 in accordance with the present invention is shown. The active bias circuit 30 is connected to a single stage amplifier (not shown). The block functions of the active bias circuit 30 include two current mirrors 32, 34, one current sink 36, one voltage source 38, a loading feedback network circuit 40, a temperature compensation circuit 42, a breakdown voltage enhancement circuit 44, a stable operations circuit 46, a bias voltage range adjustment circuit 48, and a RF blocking circuit 50. These block functions share common circuitry.

The first and second current mirror circuits 32, 34 are connected to the power amplifier for maintaining a DC quiescent current to the amplifier at a generally fixed value over a wide temperature range. The first current mirror circuit 32 is a complementary to absolute temperature (CTAT) current mirror and the second current mirror circuit 34 is a proportional to absolute temperature (PTAT) current mirror. As discussed below with reference to FIG. 4, the power amplifier is an element of the second current mirror circuit 34.

The temperature compensation circuit 42 is connected to the first current mirror circuit 32. Together, the first current mirror circuit 32 and the temperature compensation circuit 42 provide temperature compensation such that the power amplifier is able to operate over a wide temperature range, such as from –30 degrees C. to 100 degrees C.

The voltage source 38 is connected to the first current mirror circuit 32 for providing a first reference voltage Vref to the first current mirror circuit 32. The current sink 36 is connected to a transistor of the first current mirror circuit 32. The bias voltage source adjustment circuit 48 is connected to the first current mirror circuit 32 for setting a voltage provided to the first current mirror circuit 32. The loading feedback network circuit 40 is connected to the second current mirror circuit 34. The RF blocking circuit 50 is connected to the power amplifier and to the first and second current mirror circuits 32, 34. The stabilizing operation circuit 46 is connected to the first and second current mirror circuits 32, 34 for stabilizing operations thereof. The loading feedback network 40 is provided to manage the supply of current to the power amplifier under RF driving conditions. The breakdown voltage enhancement circuit 44 is provided to increase the breakdown voltage of the power amplifier when its drain voltage increases such that the bias voltage of the power amplifier reaches the breakdown voltage of the power amplifier.

Figure 4:
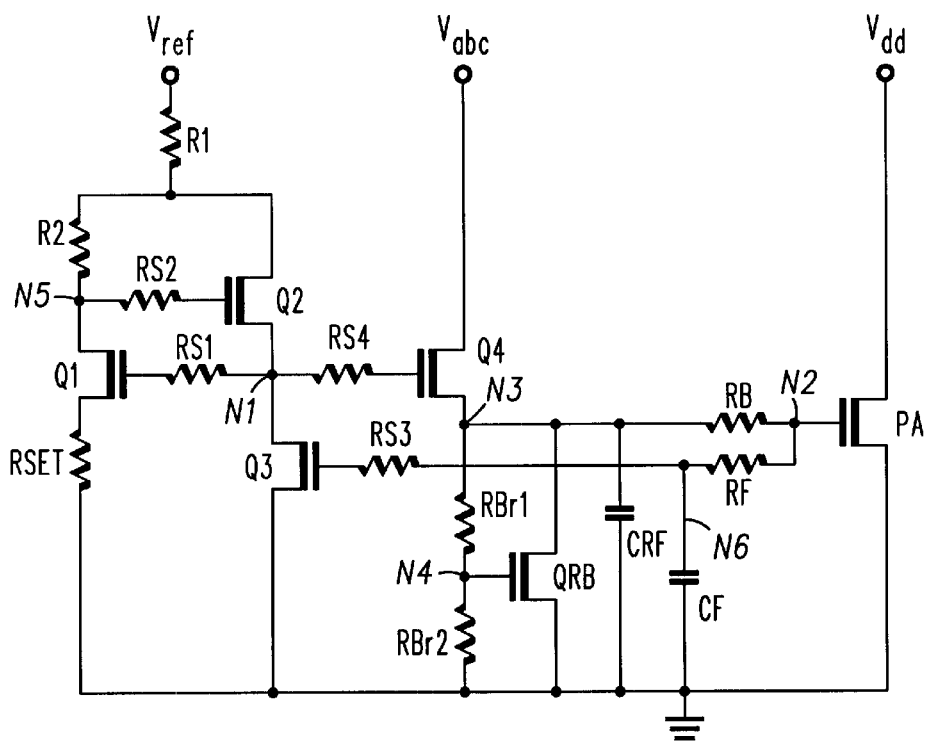
FIG. 4 is a schematic circuit diagram of a power amplifier and active bias circuit in accordance with the present invention.

Referring now to FIG. 4, a schematic circuit diagram of a presently preferred embodiment of the active bias circuit 30 is shown. The active bias circuit 30 is able to maintain a power amplifier DC quiescent current at a fixed value over a wide temperature range.

The first current mirror circuit 32 has a first transistor Q1, a second transistor Q2 and a fourth transistor Q4. The first transistor Q1 has a source, a drain and a gate. The second transistor Q2 has a gate connected to the drain of the first transistor Q1, a source connected to the gate of the first transistor Q1 at a first node N1, and a drain connected to a first reference voltage source for receiving a first reference voltage Vref. The fourth transistor Q4 has a drain connected to a second reference voltage source for receiving a second reference voltage Vabc, and a gate connected to the source of the second transistor Q2 and to the gate of the first transistor Q1 at the first node N1. The first reference voltage Vref provided by the first reference voltage source is a regulated voltage used to produce an output voltage Vbias, which is used to bias the power amplifier PA. The second reference voltage source supplies the second reference voltage Vabc, which is used to supply current to the power amplifier PA under RF driving conditions. The first reference voltage Vref may be either a fixed or a variable value and the second reference voltage Vabc is preferably a fixed value.

The second current mirror circuit 34 also has three transistors, namely, the fourth transistor Q4, the power amplifier PA, and a third transistor Q3. The third transistor Q3 has a drain connected to the first node N1, a source connected to ground and a gate connected to a gate of the power amplifier PA at a second node N2. The power amplifier PA has a drain connected to a third reference voltage source and receiving a third reference voltage Vdd and a source connected to the ground. Note, the fourth transistor Q4 is shared by the first and second current mirror circuits 32, 34.

The temperature compensation circuit 42 is connected to the first current mirror circuit 32. The temperature compensation circuit 42 includes a first resistor R1 having a first terminal connected to the first reference voltage source and a second terminal connected to the drain of the second transistor Q2. A second resistor R2 has a first terminal connected to the second terminal of the first resistor R1 and a second terminal connected to the drain of the first transistor Q1. The first and second resistors R1, R2 may be either integrated with the other circuit components on a single substrate or external to the other circuit components.

The current sink 36 comprises the third transistor Q3, which is a current sink for the second transistor Q2. The voltage source adjustment circuit 38 is formed by the first, second and third transistors Q1, Q2, Q3 and a set resistor Rset connected between the source of the first transistor Q1 and the ground.

The loading feedback network circuit 40 is connected to the second current mirror circuit 34. The loading feedback network circuit 40 includes a feedback resistor Rf having a first terminal connected to the gate of the power amplifier PA at the second node N2 and a second terminal connected to the gate of the third transistor Q3. A feedback capacitor Cf is connected between the second terminal of the feedback resistor Rf and ground.

The breakdown voltage enhancement circuit 44 includes first and second breakdown voltage resistors Rbr1, Rbr2 connected in series between the source of the fourth transistor Q4 and ground. A third node N3 is formed at the connection of the source of the fourth transistor Q4 and a terminal of the first breakdown voltage resistor Rbr1. A fourth node N4 is formed at the connection point between the first and second breakdown voltage resistors Rbr1, Rbr2. A breakdown voltage transistor QBR has a drain connected to the source of the fourth transistor Q4 and the first breakdown voltage resistor RBR1 at the third node N3, a source connected to ground, and a gate connected to the first and second breakdown resistors Rbr1, Rbr2 at the fourth node N4.

The RF blocking circuit 50 comprises a RF blocking resistor Rb having a first terminal connected to the second node N2 and a second terminal connected to the third node N3. More particularly, the RF blocking resistor Rb is connected between the gate of the power amplifier PA and the source of the fourth transistor Q4 and the drain of the breakdown voltage transistor QBR.

The bias voltage adjustment circuit 48 comprises the set resistor Rset, which is connected between the source of the first transistor Q1 and the ground.

The stabilizing operation circuit 46 may comprise one or more Miller capacitors. However, in the presently preferred embodiment, the stabilizing operation circuit 46 comprises a plurality of resistors. More particularly, the stabilizing operation circuit 46 includes a first stabilizing resistor RS1 having a first terminal connected to the first node N1 and a second terminal connected to the gate of the first transistor Q1. A second stabilizing resistor RS2 has a first terminal connected to the gate of the second transistor Q2 and a second terminal connected to a fifth node N5, which is defined by a connection between the drain of the first transistor Q1 and the second terminal of the second resistor R2. A third stabilizing resistor RS3 has a first terminal connected to the gate of the third transistor Q3 and a second terminal connected to a sixth node N6. The sixth node N6 is located between the second terminal of the feedback resistor Rf and the feedback capacitor Cf. A fourth stabilizing resistor RS4 has a first terminal connected to the first node N1 and a second terminal connected to the gate of the fourth transistor Q4.

The active bias circuit 30 also has a capacitor CRF having a first terminal connected to the third node N3 and a second terminal connected to ground. The transistors used to form the active bias circuit 30 may be field effect transistors (FETs). However, in the presently preferred embodiment, a GaAs enhanced-mode heterojunction FET is used. The FETs can be replaced directly with BJTs or any enhanced mode devices.

The operation of the active bias circuit 30 will now be described. When the first reference voltage Vref and the second reference voltage Vabc are applied, the bias voltage Vbias, which is the voltage at the second node N2, has a value determined by the first and second resistors R1, R2 and the set resistor Rset. The bias voltage Vbias will set a desired DC quiescent current of the power amplifier PA. The amount of biased current is proportional to the drain current of the third transistor Q3.

For purposes of illustration, a first order model of a FET is used to explain the active bias circuit 30 operations. It is assumed that all of the FETs are in the saturation regions as the environment is changed. The first order model is described as follows:

$$Id = \kappa \cdot (Vgs - Vth)^2 \cdot (1 + \lambda \cdot Vds) \quad (1)$$

Where:
Id is the drain current.
$\kappa$ is a process relative parameter.
Vgs is the gate to source voltage.
Vth is the threshold voltage.
$\lambda$ is the channel modulation parameter.
Vds is the drain to source voltage.

Hence we can obtain:

$$\partial Id / \partial Vth = -2\kappa \cdot (Vgs - Vth) \cdot (1 + \lambda \cdot Vds) \quad (2)$$

$$\partial Id / \partial Vgs = 2\kappa \cdot (Vgs - Vth) \cdot (1 + \lambda \cdot Vds) \quad (3)$$

In addition, IR2 can be derived, $$IR2 = (Vd2 - Vgs1 - Vgs2)/(R2 + Rset) \quad (4)$$

Case 1. Temperature Variations

When the ambient temperature increases, the threshold voltage Vth of the third transistor Q3 decreases. From equation (2), when the threshold voltage Vth decreases, Id3 (i.e., the drain current of the third transistor Q3) increases and, thus Id2 increases as well. When Id2 increases, Vd2 is reduced. From equation (4), as Vd2 decreases, the current IR2 through the second resistor R2 decreases. Therefore, the threshold voltage Vth variation over temperature will generates a PTAT current source (Id2) and a CTAT current source (IR2). When the temperature increases, Id2 (PTAT current source) increases and thus, the current IPA through the power amplifier PA increases, since IPA is a mirror of Id2. The temperature change of IPA due to the temperature change of Id2 can be described as below, $$\Delta IPA^{PTAT} = n * \Delta Id2 \quad (5)$$

where, n is total gate-width ratio of the power amplifier PA and the third transistor Q3.

When temperature increases, IR2 (CTAT current source) decreases and thus, Id4 decreases, since Id4 is a mirror of IR2. The temperature change of Id4 can be described as below, $$\Delta Id4 = m * \Delta IR2 \quad (5)$$

where, m is total gate-width ratio of Q4 and Q1.

Further, the temperature change of IPA due to the temperature change of IR2 can be derived as a function of IR2. The equation is shown below, $$\Delta IPA^{CTAT} = (m^* \Delta IR2^*(Rbr1+Rbr2) - \Delta Vth)^2 \cdot (1+\lambda \cdot Vds) \quad (6)$$

Based on the above analyses, the power amplifier PA bias current can be adjusted by both $IPA^{PTAT}$ and $IPA^{CTAT}$ over temperature. Combinations of R1 and R2 variations on IPA characteristics are listed in table 1.

TABLE 1

| Temp. Compensation IPA | R2 Increase | R2 Decrease |
|---|---|---|
| R1 Increase | CTAT | PTAT & CTAT |
| R1 Decrease | PTAT & CTAT | PTAT |

Case 2. Load Regulation

When the RF drive power increases, the gate current increases (i.e., self-bias effect), which causes a voltage drop across the RF blocking resistor Rb. This de-biasing effect degrades the transducer gain of the power amplifier PA, which translates to a lower saturated output power and PAE. The voltage drop across the RF blocking resistor Rb will cause Vgs3 to drop. From equation (1), a drop in Vgs3 will lower Id2 current and thus, Vd2 increases, causing IR2 to increase. When IR2 increases, both VRset and Id4 increase, and thus, Vset increases, which will further increase Id4. Vset is the voltage at the first node N1. The increased Id4 will boost up the bias voltage Vbias to compensate for the voltage drop across the RF blocking resistor Rb.

Case 3. Process Variation

Since current Id variation is more sensitive to Vth variation than κ, λ variations, it is assumed that κ and λ are constants and Vth has a lower value than the typical value for the analysis. If Vth has a lower value than the typical value due to the process variation, Id2 will be higher than the typical value and thus, Vd2 has a lower value than the typical value. Lower Vd2 will cause IR2 to have a lower value than the typical value, and Id4 will have a lower value than the typical value. When Id4 is lower, the bias voltage Vbias is also lower. The bias voltage Vbias is lower than the typical value at low Vth and vice-versa for the higher Vth case. Since the bias voltage Vbias and the threshold Vth have opposite effects on IPA, IPA variations can be reduced.

Case 4. Breakdown Voltage Enhancement Network

When the drain voltage of the power amplifier PA increases and approaches the breakdown voltage, QBR will be turned on and perform like a short or a low value resistor, which will increase the breakdown voltage of the power amplifier PA. In addition, under normal operating conditions, the network performs like an open loop without consuming DC power.

Figure 5:
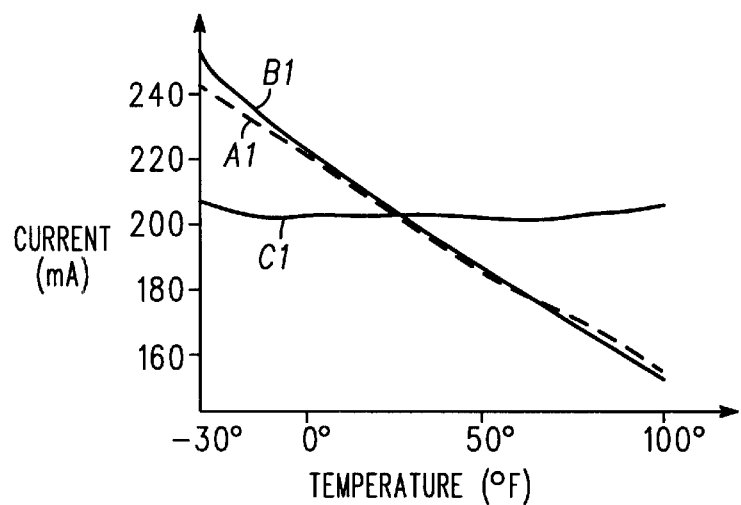
FIGS. 5–7 are graphs illustrating bias current over temperature, bias voltage drop over load effect, and bias voltage versus reference voltage Vref, respectively, for the circuits of FIGS. 1–2 and 4.

Referring now to FIG. 5, a graph of bias current versus operating temperature is shown. The graph includes a slope A1 for the first prior art circuit 10, a slope B1 for the second prior art circuit 20, and a slope C1 for the active bias circuit 30 of the present invention. As can be seen, the current provided to the power amplifier PA by the active bias circuit 30 is relatively constant at about 200 mA over the temperature range of −30 degrees C. to 100 degrees C. In contrast, the current provided by the first and second prior art circuits 10, 20 varies greatly with a change in operating temperature. More particularly, the prior art circuits 10, 20 show a ±24% bias current variation over a temperature range from −30 C. to 100 C., where as the active bias circuit 30 controls the variation within ±1% over the same temperature range.

Figure 6:
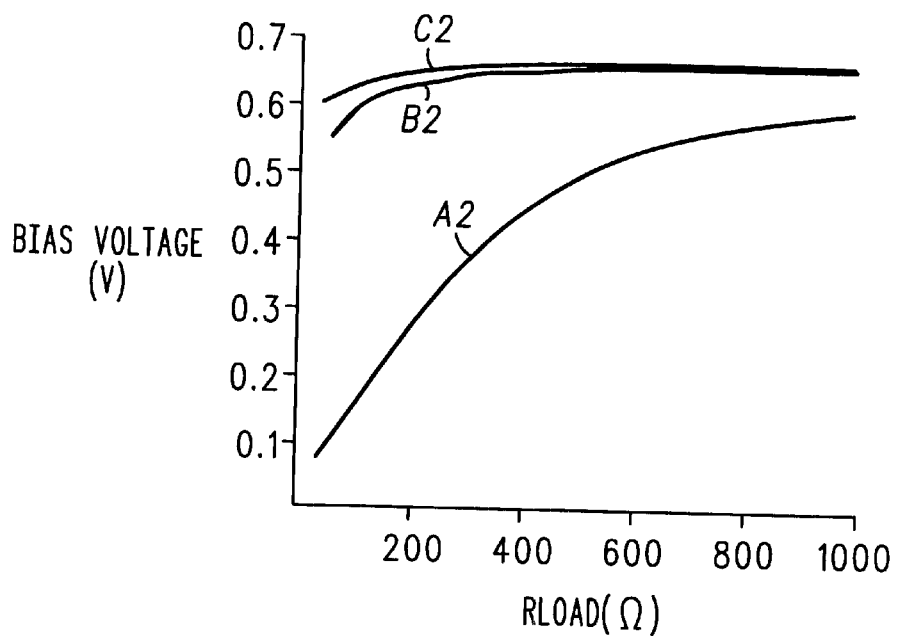

The active bias circuit 30 has superior performance against the loading effect compared to the prior art circuits 10, 20. The active bias circuit 30 compensates for the voltage drop when the load draws a large amount of current. FIG. 6 is a graph of bias voltage, which is the voltage at the second node N2 for the active bias circuit 30, versus load resistance. The graph includes a slope A2 for the first prior art circuit 10, a slope B2 for the second prior art circuit 20, and a slope C2 for the active bias circuit 30 of the present invention. As is readily apparent, the bias voltage change is much lower for the active bias circuit 30 compared to the prior art circuits. That is, as shown in FIG. 6, the prior art circuits 10, 20 have a greater than 18% voltage change for a Rb=10 Ohm and load resistance=50 Ohm, while the active bias circuit 30 of the present invention has a less than 9% voltage change for the same configuration.

The active bias circuit 30 has a higher breakdown voltage than the prior art circuits 10, 20 because the active bias circuit 30 dynamically adjusts the DC gate resistance when there is excess drain voltage of the power amplifier PA, which forces the power amplifier PA to see less gate resistance at excess drain voltage, which in turn increases the breakdown voltage and reduces the variations of drain current over drain to source voltage. The increase in the breakdown voltage and reduction in the variations of drain current over drain to source voltage improve the PAE and saturation output power of the power amplifier PA.

Figure 7:
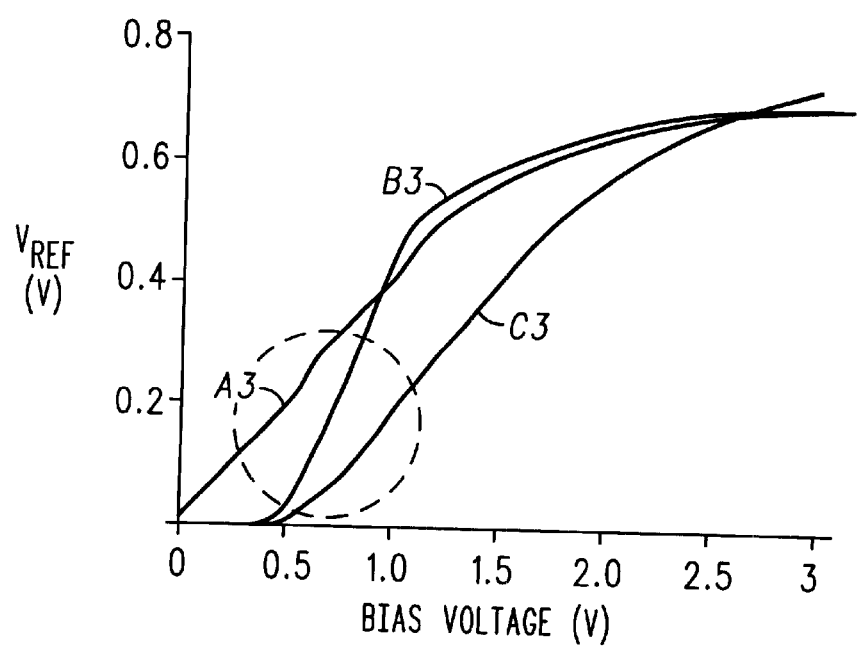

Referring now to FIG. 7, the slope of bias voltage Vbias versus Vref is much smoother for the active bias circuit 30 compared to the prior art circuits 10, 20. FIG. 7 is a graph of bias voltage versus reference voltage Vref and includes a slope A3 for the first prior art circuit 10, a slope B3 for the second prior art circuit 20 and a slope C3 for the active bias circuit 30. Providing a bias voltage Vbias with a smoother slope can be an important feature for GSM power amplifiers PAs using gate control of output power, which produce the fastest output power drop at deep sub-threshold bias range. Using the active bias circuit 30, the GSM power amplifier PA power control circuitry (e.g., variable attenuator) can be eliminated, resulting in cost savings.

As is apparent, the present invention provides an active bias circuit for a power amplifier. The active bias circuit can be used for both linear applications like CDMA and TDMA power amplifiers and saturated applications like GSM and analog power amplifiers. The active bias circuit is suitable for multi-mode and multi-band cellular telephones. As will be appreciated, the active bias circuit has a simple temperature compensation scheme, load regulation capability, and breakdown voltage enhancement. Further, the active bias circuit is readily implemented in an integrated circuit, and may be implemented using a variety of device types and technologies, such as FETs, BJTS, HBTs and LDMOS. It is understood, however, that this invention is not limited to the particular embodiments disclosed, but covers modifications within the spirit and scope of the present invention as defined by the appended claims.

What is claimed is:

1. An active bias circuit connected to a power amplifier, comprising:

first and second current mirror circuits connected to the power amplifier for maintaining a DC quiescent current to the power amplifier at a generally fixed value over a wide temperature range, wherein the power amplifier is an element of the second current mirror circuit;

a temperature compensation circuit connected to the first current mirror circuit for providing temperature compensation therewith;

a first reference voltage source connected to the first current mirror circuit by way of the temperature compensation circuit for providing a first reference voltage Vref to the first current mirror circuit;

a current sink connected to the first current mirror circuit;

a voltage source adjustment circuit connected to the first current mirror circuit for setting a voltage provided to the first current mirror circuit;

the first current mirror circuit comprises:

a first transistor having a source, a drain and a gate;

a second transistor having a gate connected to the drain of the first transistor and a source connected to the gate of the first transistor at a first node; and a fourth transistor having a drain connected to a second reference voltage source and receiving a second reference voltage Vabc, a source connected to ground, and a gate connected to the source of the second transistor and the gate of the first transistor at the first node.

2. The active bias circuit of claim 1, wherein the second current mirror circuit comprises:

the fourth transistor;

a third transistor having a drain connected to the first node, a source connected to the ground and a gate connected to a gate of the power amplifier at a second node; and the power amplifier, wherein the power amplifier has a drain connected to a third reference voltage source and receiving a third reference voltage Vdd and a source connected to the ground.

3. The active bias circuit of claim 2, wherein the temperature compensation circuit connected to the first current mirror circuit comprises:

a first resistor R1 having a first terminal connected to the first reference voltage source and a second terminal connected to a drain of the second transistor; and a second resistor R2 having a first terminal connected to the second terminal of the first resistor R1 and a second terminal connected to the drain of the first transistor.

4. The active bias circuit of claim 2, wherein the current sink comprises the third transistor, which is shared by the first and second current mirror circuits, being connected to the second transistor.

5. The active bias circuit of claim 2, wherein the voltage source adjustment circuit comprises a set resistor Rset connected between the source of the first transistor and the ground.

6. The active bias circuit of claim 2, further comprising a loading feedback network circuit connected to the second current mirror circuit.

7. The active bias circuit of claim 6, wherein the loading feedback network circuit comprises:

a feedback resistor Rf having a first terminal connected to the gate of the power amplifier at the second node; and a feedback capacitor Cf connected between a second terminal of the feedback resistor Rf and the ground.

8. The active bias circuit of claim 7, further comprising a breakdown voltage enhancement circuit, the breakdown voltage enhancement circuit including:

first and second breakdown voltage resistors Rbr1, Rbr2 connected in series between the source of the fourth transistor and the ground, wherein a third node is formed at the connection of the source of the fourth transistor and a terminal of the first breakdown voltage resistor Rbr1; and a breakdown voltage transistor having a drain connected to the fourth transistor and the first breakdown voltage resistor Rbr1 at the third node, a source connected to the ground, and a gate connected to a fourth node located between the first and second breakdown resistors Rbr1, Rbr2.

9. The active bias circuit of claim 8, further comprising an RF blocking resistor having a first terminal connected to the second node and a second terminal connected to the third node.

10. The active bias circuit of claim 8, further comprising a capacitor having a first terminal connected to the third node and a second terminal connected to the ground.

11. The active bias circuit of claim 8, further comprising a stabilizing operation circuit connected to the first and second current mirror circuits for stabilizing operations thereof.

12. The active bias circuit of claim 11, wherein the stabilizing operation circuit comprises one or more Miller capacitors.

13. The active bias circuit of claim 11, wherein the stabilizing operation circuit comprises a plurality of resistors.

14. The active bias circuit of claim 13, wherein the plurality of resistors of the stabilizing operation circuit comprises:

a first stabilizing resistor RS1 having a first terminal connected to the first node and a second terminal connected to the gate of the first transistor;

a second stabilizing resistor RS2 having a first terminal connected to the gate of the second transistor and a second terminal connected to the drain of the first transistor and the second terminal of the second resistor R2 at a fifth node;

a third stabilizing resistor RS3 having a first terminal connected to the gate of the third transistor and a second terminal connected to a sixth node located between the second terminal of the feedback resistor Rf and the feedback capacitor Cf; and a fourth stabilizing resistor RS4 having a first terminal connected to the first node and a second terminal connected to the gate of the fourth transistor.

15. An active bias circuit for maintaining a power amplifier DC quiescent current at a fixed value over a wide temperature range, comprising:

a first current mirror circuit including a first transistor, a second transistor having a gate connected to a drain of the first transistor and a drain connected to a first reference voltage source for receiving a first reference voltage Vref, and a fourth transistor having a drain connected to a second reference voltage source for receiving a second reference voltage Vabc, and a gate connected to a source of the second transistor and to a gate of the first transistor;

a second current mirror circuit including the fourth transistor, a third transistor having a drain connected to the source of the second transistor at a first node, a source connected to ground, and a power amplifier having a drain connected to a third reference voltage source for receiving a third reference voltage Vdd, a source connected to the ground, and a gate connected to a gate of the third transistor at a second node;

a temperature compensation circuit including a first resistor R1 having a first terminal connected to the first reference voltage source and a second terminal connected to the drain of the second transistor, and a second resistor R2 having a first terminal connected to the second terminal of the first resistor R1 and a second terminal connected to the drain of the first transistor; and a voltage source adjustment circuit including a set resistor Rset connected between a source of the first transistor and the ground.

16. The active bias circuit of claim 15, further comprising a loading feedback network circuit connected to the second current mirror circuit.

17. The active bias circuit of claim 16, wherein the loading feedback network circuit comprises:

a feedback resistor Rf having a first terminal connected to the gate of the power amplifier at the second node and a second terminal connected to the gate of the third transistor; and a feedback capacitor Cf connected between the second terminal of the feedback resistor Rf and the ground.

18. The active bias circuit of claim 17, further comprising a breakdown voltage enhancement circuit, the breakdown voltage enhancement circuit including:

first and second breakdown voltage resistors Rbr1, Rbr2 connected in series between the source of the fourth transistor and the ground, wherein a third node is formed at the connection of the source of the fourth transistor and a terminal of the first breakdown voltage resistor Rbr1; and a breakdown voltage transistor having a drain connected to the source of the fourth transistor and the first breakdown voltage resistor Rbr1 at the third node, a source connected to the ground, and a gate connected to a fourth node located between the first and second breakdown resistors Rbr1, Rbr2.

19. The active bias circuit of claim 18, further comprising an RF blocking resistor Rb having a first terminal connected to the second node and a second terminal connected to the third node.

20. The active bias circuit of claim 18, further comprising a capacitor having a first terminal connected to the third node and a second terminal connected to the ground.

21. The active bias circuit of claim 18, further comprising a stabilizing operation circuit, the stabilizing operation circuit including:

a first stabilizing resistor RS1 having a first terminal connected to the first node and a second terminal connected to the gate of the first transistor;

a second stabilizing resistor RS2 having a first terminal connected to the gate of the second transistor and a second terminal connected to the drain of the first transistor and the second terminal of the second resistor R2 at a fifth node;

a third stabilizing resistor RS3 having a first terminal connected to the gate of the third transistor and a second terminal connected to a sixth node located between the second terminal of the feedback resistor Rf and the feedback capacitor Cf; and a fourth stabilizing resistor RS4 having a first terminal connected to the first node and a second terminal connected to the gate of the fourth transistor.

* * * * *